(12) United States Patent
Chen

(10) Patent No.: US 10,305,482 B2
(45) Date of Patent: May 28, 2019

(54) VOLTAGE LEVEL SHIFTER

(71) Applicant: Winbond Electronics Corp., Taichung (TW)

(72) Inventor: Chung-Zen Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/650,983

(22) Filed: Jul. 17, 2017

(65) Prior Publication Data

US 2018/0302066 A1 Oct. 18, 2018

(30) Foreign Application Priority Data

Apr. 13, 2017 (CN) .......................... 2017 1 0238957

(51) Int. Cl.
*H03K 19/018* (2006.01)
*H03K 19/0185* (2006.01)
*H02M 3/155* (2006.01)

(52) U.S. Cl.
CPC .... *H03K 19/018521* (2013.01); *H02M 3/155* (2013.01)

(58) Field of Classification Search
CPC ... H03K 19/018507; H03K 19/018514; H03K 19/018521; H03K 19/018528
See application file for complete search history.

(56) References Cited

U.S. PATENT DOCUMENTS

| 5,969,542 A * | 10/1999 | Maley ..................... H03K 3/012 326/17 |
| 6,864,718 B2 * | 3/2005 | Yu ..................... H03K 3/356113 326/62 |
| 7,151,400 B2 * | 12/2006 | Chen ................. H03K 3/356113 327/333 |
| 7,468,615 B1 * | 12/2008 | Tan ................... H03K 19/00315 326/68 |
| 8,339,178 B2 | 12/2012 | Cheng et al. |
| 8,358,165 B2 | 1/2013 | Chou et al. |
| 8,604,868 B2 * | 12/2013 | Ucciardello ......... H03K 17/102 327/333 |

(Continued)

FOREIGN PATENT DOCUMENTS

| CN | 201918978 | 8/2011 |
| TW | I330922 | 9/2010 |

OTHER PUBLICATIONS

"Office Action of Taiwan Counterpart Application," dated Jan. 2, 2018, p. 1-p. 6, in which the listed reference was cited.

(Continued)

*Primary Examiner* — Thomas J. Hiltunen
(74) *Attorney, Agent, or Firm* — JCIPRNET

(57) ABSTRACT

A voltage level shifter including a voltage level shifting circuit and a boost circuit is provided. The voltage level shifting circuit includes a first reference input end, a second reference input end, a first boosted input end, and a second boosted input end. The voltage level shifting circuit operates between a first voltage and a second voltage. The boost circuit is coupled to the voltage level shifting circuit. The boost circuit boosts the first boosted input end and the second boosted input end according to voltage values of the first reference input end and the second reference input end to reduce a transient current that flows from the first voltage to the second voltage.

11 Claims, 1 Drawing Sheet

(56) References Cited

U.S. PATENT DOCUMENTS

| | | | |
|---|---|---|---|
| 9,385,722 B2* | 7/2016 | Trivedi | H03K 3/356113 |
| 9,385,723 B1* | 7/2016 | Zhao | H03K 19/00315 |
| 9,680,472 B2* | 6/2017 | Trivedi | H03K 19/018521 |
| 9,762,216 B1* | 9/2017 | Sinangil | H03K 19/018521 |
| 2002/0180508 A1* | 12/2002 | Kanno | H03K 19/0016 |
| | | | 327/333 |
| 2003/0042965 A1* | 3/2003 | Kanno | H03K 3/356113 |
| | | | 327/333 |
| 2003/0169225 A1* | 9/2003 | Tobita | H03K 3/356113 |
| | | | 345/100 |
| 2005/0285658 A1* | 12/2005 | Schulmeyer | H03K 25/02 |
| | | | 327/333 |
| 2006/0012415 A1* | 1/2006 | Chen | H03K 3/356113 |
| | | | 327/333 |
| 2007/0164805 A1* | 7/2007 | Horibata | H03K 19/018528 |
| | | | 327/333 |
| 2007/0268230 A1* | 11/2007 | Park | G09G 3/3611 |
| | | | 345/100 |
| 2008/0007314 A1* | 1/2008 | Ricard | H03K 3/356113 |
| | | | 327/333 |
| 2008/0204110 A1* | 8/2008 | Ishida | H03K 3/356104 |
| | | | 327/333 |
| 2010/0109744 A1* | 5/2010 | Czech | H03K 3/356113 |
| | | | 327/333 |
| 2011/0063012 A1* | 3/2011 | Chan | H03K 3/356113 |
| | | | 327/333 |
| 2012/0274382 A1* | 11/2012 | Ucciardello | H03K 3/356113 |
| | | | 327/333 |
| 2013/0222037 A1* | 8/2013 | Zhang | H03K 3/356182 |
| | | | 327/333 |
| 2016/0173070 A1 | 6/2016 | Trivedi et al. | |
| 2016/0294394 A1* | 10/2016 | Trivedi | H03K 19/018521 |

OTHER PUBLICATIONS

"Office Action of Taiwan Counterpart Application," dated Dec. 19, 2018, p. 1-p. 4.

* cited by examiner

VOLTAGE LEVEL SHIFTER

CROSS-REFERENCE TO RELATED APPLICATION

This application claims the priority benefit of China application serial no. 201710238957.3, filed on Apr. 13, 2017. The entirety of the above-mentioned patent application is hereby incorporated by reference herein and made a part of this specification.

BACKGROUND OF THE INVENTION

1. Field of the Invention

The invention generally relates to an electronic circuit, more particularly, to a voltage level shifter.

2. Description of Related Art

With today's rapid development of electronic technology, integrated electronic products having a variety of functions simultaneously have become the focus of market chase. In order to achieve a variety of functions in a single product, switching between different operating voltage ranges is the basic technology required for such product. A protagonist for carrying out the switching between the operating voltage ranges is the so-called voltage level shifter. For example, in a memory storage device, it typically includes a voltage level shifter for performing a shift operation between two different voltage levels.

In the conventional art, when the voltage level shifter shifts the voltage signal from a low level to a high level, if a transient current therein is too high, then a power consumption of the voltage level shifter may easily become too much and a signal transition speed may also become too slow. Therefore, how to provide a voltage level shifter with a low transient current and a fast signal transition speed is an important issue for those technicians of the field.

SUMMARY OF THE INVENTION

The invention is directed to a voltage level shifter with a low transient current and a fast signal transition speed.

In an exemplary embodiment of the invention, the voltage level shifter includes a voltage level shifting circuit and a boost circuit. The voltage level shifting circuit includes a first reference input end, a second reference input end, a first boosted input end, and a second boosted input end. The voltage level shifting circuit operates between a first voltage and a second voltage. The boost circuit is coupled to the voltage level shifting circuit. The boost circuit boosts the first boosted input end and the second boosted input end according to voltage values of the first reference input end and the second reference input end, so as to reduce a transient current that flows from the first voltage to the second voltage.

According to the above descriptions, in the exemplary embodiments of the invention, the voltage level shifter includes the boost circuit for boosting the first boosted input end and the second boosted input end, so as to reduce the transient current and increase a signal transition speed.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
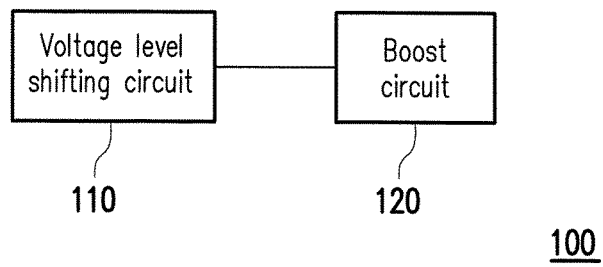
FIG. 1 illustrates a schematic diagram of a voltage level shifter according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

The term "coupling/coupled" used in this specification (including claims) of the disclosure may refer to any direct or indirect connection means. In addition, the term "signal" can refer to a current, a voltage, a charge, a temperature, data, electromagnetic wave or any one or multiple signals.

Figure 2:
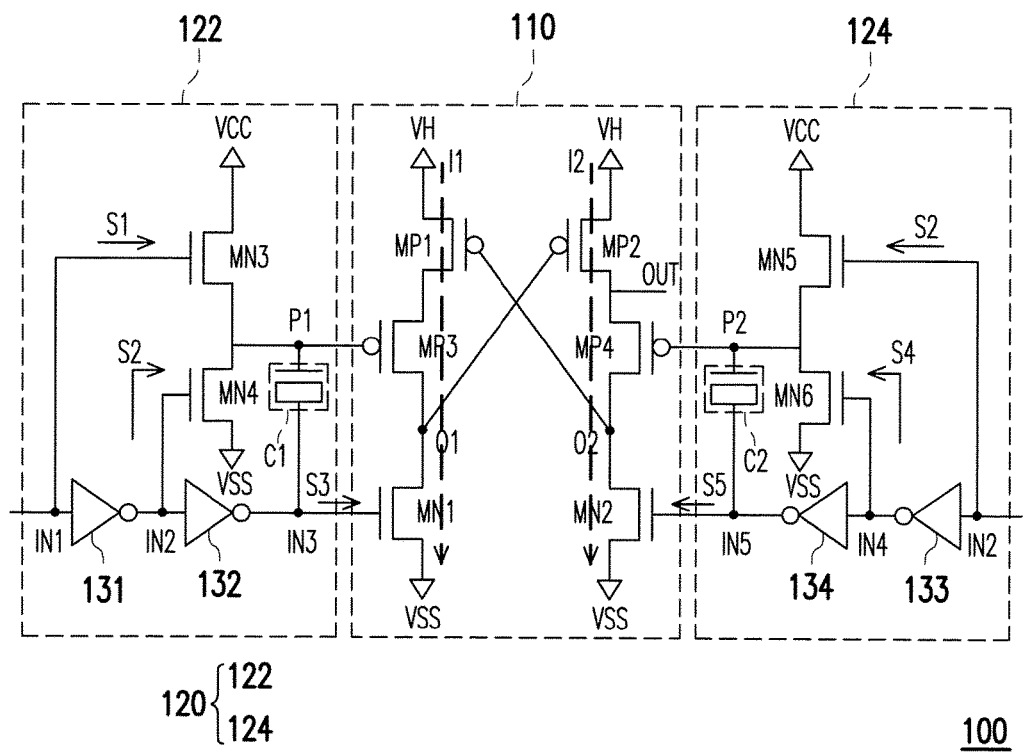
FIG. 2 illustrates a schematic circuit diagram of the voltage level shifter in the embodiment of FIG. 1.

Referring to FIG. 1 and FIG. 2, a voltage level shifter 100 of the present embodiment includes a voltage level shifting circuit 110 and a boost circuit 120. The boost circuit 120 is coupled to the voltage level shifting circuit 110. In the present embodiment, the voltage level shifting circuit 110 includes a first reference input end IN3, a second reference input end IN5, a first boosted input end P1, and a second boosted input end P2. The voltage level shifting circuit 110 operates between the first voltage VH and the second voltage VSS. The first voltage VH is higher than the second voltage VSS. In the present embodiment, the boost circuit 120 boosts the first boosted input end P1 and the second boosted input end P2 according to voltage values of the first reference input end IN3 and the second reference input end IN5, so as to reduce a transient current I1 or I2 that flows from the first voltage VH to the second voltage VSS.

In the present embodiment, the voltage level shifting circuit 110 includes a first transistor MP1, a second transistor MP2, a third transistor MP3, a fourth transistor MP4, a fifth transistor MN1, and a sixth transistor MN2. The first transistor MP1, the second transistor MP2, the third transistor MP3, the fourth transistor MP4, the fifth transistor MN1, and the sixth transistor MN2 each includes a first end, a second end and a control end. The first end of the first transistor MP1 is coupled to the first voltage VH. The first end of the second transistor MP2 is coupled to the first voltage VH. The second end of the second transistor MP2 serves as an output end OUT of the voltage level shifting circuit 110. The first end of the third transistor MP3 is coupled to the second end of the first transistor MP1. The second end of the third transistor MP3 is coupled to the control end of the second transistor MP2. The control end of the third transistor MP3 serves as the first boosted input end P1. The first end of the fourth transistor MP4 is coupled to the second end of the second transistor MP2. The second end of the fourth transistor MP4 is coupled to the control end of the first transistor MP1. The control end of the fourth transistor MP4 serves as the second boosted input end P2. The first end of the fifth transistor MN1 is coupled to the control end of the second transistor MP2 and the second end of the third transistor MP3. The second end of the fifth transistor MN1 is coupled to the second voltage VSS. The control end of the fifth transistor MN1 serves as the first reference input end IN3. The first end of the sixth transistor MN2 is coupled to the control end of the first transistor MP1 and the second end of the fourth transistor MP4. The second end of the sixth transistor MN2 is coupled to the second voltage VSS. The control end of the sixth transistor MN2 serves as the second reference input end IN5. In the present embodiment, the first transistor MP1, the second transistor MP2, the third transistor MP3 and the fourth transistor MP4 are P-type metal-oxide-semiconductor transistors. The fifth transistor MN1 and the sixth transistor MN2 are N-type metal-oxide-semiconductor transistors.

In the present embodiment, a first current I1 flows from the first end of the first transistor MP1, through the first transistor MP1, the third transistor MP3 and the fifth transistor MN1, to the second end of the fifth transistor MN1. A second current I2 flows from the first end of the second transistor MP2, through the second transistor MP2, the fourth transistor MP4 and the sixth transistor MN2, to the second end of the sixth transistor MN2. One of the first current I1 and the second current I2 is being used as the transient current. In the present embodiment, the third transistor MP3 is coupled between the first transistor MP1 and the fifth transistor MN1, and can lower a current value of the first current I1 during a voltage level conversion period, thereby reducing the power consumption of the first voltage VH and increasing a voltage transition speed of an output signal of the output end OUT. In the present embodiment, fourth transistor MP4 is coupled between the second transistor MP2 and the sixth transistor MN2, and can lower a current value of the second current I2 during the voltage level conversion period, thereby reducing the power consumption of the first voltage VH and increasing the voltage transition speed of the output signal of the output end OUT.

In the present embodiment, the voltage level shifting circuit 110 is, for example, a single-ended output or a circuit configuration of differential input. The voltage level shifting circuit 110 receives differential input signals S3 and S5 from the first reference input end IN3 and the second reference input end IN5. The voltage level shifting circuit 110 outputs the output signal from the output end OUT. The voltage level shifting circuit 110 shifts the voltage levels of the differential input signals S3 and S5 from a third voltage VCC to the first voltage VH so as to serve as the output signal. The first voltage VH is higher than the third voltage VCC. In one embodiment, an endpoint connecting the first transistor MP1 and the third transistor MP3 may also serve as another output end of the voltage level shifting circuit 110 for outputting the output signal.

In the present embodiment, the boost circuit 120 operates between the third voltage VCC and the second voltage VSS. The boost circuit 120 includes a first boost circuit block 122 and a second boost circuit block 124. The first boost circuit block 122 is coupled to the control end of the third transistor MP3 and the control end of the fifth transistor MN1. The second boost circuit block 124 is coupled to the control end of the fourth transistor MP4 and the control end of the sixth transistor MN2.

In the present embodiment, the first boost circuit block 122 includes a seventh transistor MN3, an eighth transistor MN4, a first capacitor C1, a first inverter 131, and a second inverter 132. The seventh transistor MN3 and the eighth transistor MN4 each includes a first end, a second end and a control end. The first end of the seventh transistor MN3 is coupled to the third voltage VCC. The second end of the seventh transistor MN3 is coupled to the control end of the third transistor MP3. The control end of the seventh transistor MN3 receives a first signal S1. The first end of the eighth transistor MN4 is coupled to the control end of the third transistor MP3 and the second end of the seventh transistor MN3. The second end of the eighth transistor MN4 is coupled to the second voltage VSS. The control end of the eighth transistor MN4 receives a second signal S2. In the present embodiment, the seventh transistor MN3 and the eighth transistor MN4 are N-type metal-oxide-semiconductor transistors.

In the present embodiment, the first capacitor C1 includes a first end and a second end. The first end of the first capacitor C1 is coupled to the control end of the third transistor MP3. The second end of the first capacitor C1 is coupled to the control end of the fifth transistor MN1. The control end of the fifth transistor MN1 receives a third signal S3. The first inverter 131 includes a first end IN1 and a second end IN2. The first end IN1 of the first inverter 131 is coupled to the control end of the seventh transistor MN3. The second end IN2 of the first inverter 131 is coupled to the control end of the eighth transistor MN4. The second inverter 132 includes a first end IN2 and a second end IN3. The first end IN2 of the second inverter 132 is coupled to the control end of the eighth transistor MN4. The second end IN3 of the second inverter 132 is coupled to the control end of the fifth transistor MN1. In the present embodiment, the first inverter 131 inverts a phase of the first signal S1 to generate the second signal S2, and second inverter 132 inverts a phase of the second signal S2 to generate the third signal S3. Therefore, first signal S1 and the second signal S2 are opposite phases. The first signal S1 and the third signal S3 in phase.

In the present embodiment, the first transistor MP1 and the third transistor MP3 are connected in series configuration. Such design can reduce a voltage fighting between the third transistor MP3 and the fifth transistor MN1 at an endpoint O1. When a level of the first signal S1 at the input end IN1 shifts from the second voltage VSS to the third voltage VCC, the seventh transistor MN3 is conducted, and the first boosted input end P1 is boosted to approximately a level of the third voltage VCC. Next, the first signal S1, after being delayed by the first inverter 131 and the second inverter 132, generates the third signal S3 at the first reference input end IN3, wherein a voltage level thereof is approximately the level of the third voltage VCC. Now, the first boosted input end P1 that is boosted to approximately the level of the third voltage VCC is further boosted with approximately the level of the third voltage VCC according to the first reference input end IN3. Therefore, during the voltage level conversion period, the current value of the first current I1 can be lowered, thereby reducing the power consumption of the first voltage VH and increasing the voltage transition speed of the output end of the output end OUT. In one embodiment, the first voltage VH is, for example, generated by a charge pumping circuit according to the third voltage VCC, and reducing the power consumption of the first voltage VH can further reduce the load of the charge pumping circuit.

In the present embodiment, the second boost circuit block 124 includes a ninth transistor MN5, a tenth transistor MN6, a second capacitor C2, a third inverter 133, and a fourth inverter 134. The ninth transistor MN5 and the tenth transistor MN6 each includes a first end, a second end and a control end. The first end of the ninth transistor MN5 is coupled to the third voltage VCC. The second end of the ninth transistor MN5 is coupled to the control end of the fourth transistor MP4. The control end of the ninth transistor MN5 receives the second signal S2. The first end of the tenth transistor MN6 is coupled to the control end of the third transistor MP3 and the second end of the ninth transistor MN5. The second end of the tenth transistor MN6 is coupled to the second voltage VSS. The control end of the tenth transistor MN6 receives a fourth signal S4. In the present embodiment, the ninth transistor MN5 and the tenth transistor MN6 are N-type metal-oxide-semiconductor transistors.

In the present embodiment, the second capacitor includes a first end and a second end. The first end of the second capacitor C2 is coupled to the control end of the fourth transistor MP4. The second end of the second capacitor C2 is coupled to the control end of the sixth transistor MN2. The control end of the sixth transistor MN2 receives a fifth signal S5. In the present embodiment, the third signal S3 and the fifth signal S5 serve as differential input signals that are inputted into the voltage level shifting circuit 110 respectively from the first reference input end IN3 and the second reference input end IN5. The third inverter 133 includes a first end and a second end. The first end of the third inverter 133 is coupled to the control end of the ninth transistor MN5. The second end of the third inverter 133 is coupled to the control end of the tenth transistor MN6. The fourth inverter 134 includes a first end and a second end. The first end of the fourth inverter 134 is coupled to the control end of the tenth transistor MN6. The second end of the fourth inverter 134 is coupled to the control end of the sixth transistor MN2. In the present embodiment, the third inverter 133 inverts the phase of the second signal S2 to generate the fourth signal S4, and the fourth inverter 134 inverts a phase of the fourth signal S4 to generate the fifth signal S5. Therefore, the second signal S2 and the fourth signal S4 are opposite phases. The second signal S2 and the fifth signal S5 are in phase. In the present embodiment, the operation of the second boost circuit block 124 may be referred to the first boost circuit block 122, and a relative position of its node is complementary to the voltage, such that the level of the second signal S2 at the input end IN2 and the level of the first signal S1 at the input end IN1 are opposite phases. Thus, the operation of the second boost circuit block 124 will not be repeated herein.

In summary, in the exemplary embodiments of the invention, the boost circuit boosts the input end of the voltage level shifting circuit according to the voltage values of the third voltage and the reference input end, so as to reduce the transient current that flows from the first voltage to the second voltage and increases the signal transition speed of the output end.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A voltage level shifter, comprising:
   a voltage level shifting circuit, comprising a first reference input end, a second reference input end, a first boosted input end, and a second boosted input end, and operating between a first voltage and a second voltage; and
   a boost circuit, coupled to the voltage level shifting circuit, and configured to boost the first boosted input end and the second boosted input end according to voltage values of the first reference input end and second reference input end so as to reduce a transient current that flows from the first voltage to the second voltage,
   wherein the boost circuit comprises a first capacitor and a second capacitor, the first capacitor is coupled between the first reference input end and the first boosted input end, and the second capacitor is coupled between the second reference input end and the second boosted input end,
   wherein the boost circuit comprises at least four transistors, at least one of the at least four transistors having a gate control end receiving a first signal and at least the other one of the at least four transistors having a gate control end receiving a second signal,
   wherein the first signal and the second signal are opposite phases,
   the voltage level shifter further comprises:
   a first transistor, comprising a first end, a second end and a control end, and the first end of the first transistor being coupled to the first voltage;
   a second transistor, comprising a first end, a second end and a control end, the first end of the second transistor being coupled to the first voltage, and the second end of the second transistor serving as an output end of the voltage level shifting circuit;
   a third transistor, comprising a first end, a second end and a control end, the first end of the third transistor being coupled to the second end of the first transistor, the second end of the third transistor being coupled to the control end of the second transistor, and the control end of the third transistor serving as the first boosted input end;
   a fourth transistor, comprising a first end, a second end and a control end, the first end of the fourth transistor being coupled to the second end of the second transistor, the second end of the fourth transistor being coupled to the control end of the first transistor, and the control end of the fourth transistor serving as the second boosted input end;
   a fifth transistor, comprising a first end, a second end and a control end, the first end of the fifth transistor being coupled to the control end of the second transistor and the second end of the third transistor, the second end of the fifth transistor being coupled to the second voltage, and the control end of the fifth transistor serving as the first reference input end; and
   a sixth transistor, comprising a first end, a second end and a control end, the first end of the sixth transistor being coupled to the control end of the first transistor and the second end of the fourth transistor, the second end of the sixth transistor being coupled to the second voltage, and the control end of the sixth transistor serving as the second reference input end,
   wherein the boost circuit comprises:
   a first boost circuit block, coupled to the control end of the third transistor and the control end of the fifth transistor; and
   a second boost circuit block, coupled to the control end of the fourth transistor and the control end of the sixth transistor,
   wherein the first boost circuit block comprises:
   a seventh transistor, comprising a first end, a second end and a control end, the first end of the seventh transistor being coupled to a third voltage, the second end of the seventh transistor being coupled to the control end of the third transistor, and the control end of the seventh transistor receiving the first signal;
   an eighth transistor, comprising a first end, a second end and a control end, the first end of the eighth transistor being coupled to the control end of the third transistor and the second end of the seventh transistor, the second end of the eighth transistor being coupled to the second voltage, and the control end of the eighth transistor receiving the second signal; and the first capacitor, comprising a first end and a second end, the first end of the first capacitor being coupled to the control end of the third transistor, the second end of the first capacitor being coupled to the control end of the fifth transistor, wherein the control end of the fifth transistor receives a third signal.

2. The voltage level shifter as recited in claim 1, wherein the boost circuit operates between a third voltage and the second voltage, and boosts the first boosted input end and the second boosted input end according to the third voltage so as to reduce the transient current that flows from the first voltage to the second voltage.

3. The voltage level shifter as recited in claim 1, wherein a first current flows from the first end of the first transistor, through the first transistor, the third transistor and the fifth transistor, to the second end of the fifth transistor, a second current flows from the first end of the second transistor, through the second transistor, the fourth transistor and the sixth transistor, to the second end of the sixth transistor, and the transient current is selected from one of the first current and the second current.

4. The voltage level shifter as recited in claim 1, wherein the first transistor, the second transistor, the third transistor and the fourth transistor are P-type metal-oxide-semiconductor transistors, and the fifth transistor and the sixth transistor are N-type metal-oxide-semiconductor transistors.

5. The voltage level shifter as recited in claim 1, wherein the voltage level shifting circuit further comprises an output end, and the voltage level shifting circuit receives a differential input signal from the first reference input end and the second reference input end and outputs an output signal from the output end, wherein the voltage level shifting circuit shifts the differential input signal from a third voltage to the first voltage so as to serve as the output signal.

6. The voltage level shifter as recited in claim 1, wherein the first signal and the third signal are in phase.

7. The voltage level shifter as recited in claim 6, wherein the first boost circuit block further comprises:
a first inverter, comprising a first end and a second end, the first end of the first inverter being coupled to the control end of the seventh transistor, and the second end of the first inverter being coupled to the control end of the eighth transistor; and a second inverter, comprising a first end and a second end, the first end of the second inverter being coupled to the control end of the eighth transistor, and the second end of the second inverter being coupled to the control end of the fifth transistor.

8. The voltage level shifter as recited in claim 1, wherein the second boost circuit block comprises:
a ninth transistor, comprising a first end, a second end and control end, the first end of the ninth transistor being coupled to the third voltage, the second end of the ninth transistor being coupled to the control end of the fourth transistor, and the control end of the ninth transistor receiving the second signal;
a tenth transistor, comprising a first end, a second end and a control end, the first end of the tenth transistor being coupled to the control end of the third transistor and the second end of the ninth transistor, the second end of the tenth transistor being coupled to the second voltage, and the control end of the tenth transistor receiving a fourth signal; and
the second capacitor, comprising a first end and a second end, the first end of the second capacitor being coupled to the control end of the fourth transistor, the second end of the second capacitor being coupled to the control end of the sixth transistor, and the control end of the sixth transistor receiving a fifth signal.

9. The voltage level shifter as recited in claim 8, wherein the second signal and the fourth signal are opposite phases, and the second signal and the fifth signal are in phase.

10. The voltage level shifter as recited in claim 9, wherein the second boost circuit block further comprises:
a third inverter, comprising a first end and a second end, the first end of the third inverter being coupled to the control end of the ninth transistor, and the second end of the third inverter being coupled to the control end of the tenth transistor; and
a fourth inverter, comprising a first end and a second end, the first end of the fourth inverter being coupled to the control end of the tenth transistor, and the second end of the fourth inverter being coupled to the control end of the sixth transistor.

11. The voltage level shifter as recited in claim 8, wherein the seventh transistor, the eighth transistor, the ninth transistor and the tenth transistor are N-type metal-oxide-semiconductor transistors.

* * * * *